(12) United States Patent
Chen

(10) Patent No.: US 9,530,901 B2
(45) Date of Patent: Dec. 27, 2016

(54) DECOUPLING FINFET CAPACITORS

(75) Inventor: Chung-Hui Chen, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/362,796

(22) Filed: Jan. 31, 2012

(65) Prior Publication Data

US 2013/0193500 A1 Aug. 1, 2013

(51) Int. Cl.
*H01L 27/06* (2006.01)
*H01L 27/088* (2006.01)
*H01L 49/02* (2006.01)
*H01L 29/94* (2006.01)
*H01L 27/08* (2006.01)

(52) U.S. Cl.
CPC .......... *H01L 29/94* (2013.01); *H01L 27/0629* (2013.01); *H01L 27/0811* (2013.01); *H01L 28/92* (2013.01); *H01L 29/945* (2013.01); *H01L 27/0886* (2013.01)

(58) Field of Classification Search
CPC ............................... H01L 29/94; H01L 29/945
USPC .......................................................... 257/296
See application file for complete search history.

(56) References Cited

U.S. PATENT DOCUMENTS

| | | | |
|---|---|---|---|
| 2003/0047777 A1* | 3/2003 | In't Zandt et al. | 257/329 |
| 2004/0188739 A1* | 9/2004 | Takenaka et al. | 257/301 |
| 2007/0018239 A1* | 1/2007 | Chen et al. | 257/329 |
| 2007/0166914 A1* | 7/2007 | Chen et al. | 438/243 |
| 2007/0279093 A1* | 12/2007 | Senda et al. | 326/81 |
| 2010/0032799 A1* | 2/2010 | Bartley et al. | 257/532 |
| 2011/0095359 A1* | 4/2011 | Tipirneni et al. | 257/331 |
| 2011/0169131 A1* | 7/2011 | Nakos et al. | 257/532 |
| 2011/0284946 A1* | 11/2011 | Kiyotoshi | 257/324 |
| 2012/0008367 A1* | 1/2012 | Kajiyama | 365/148 |
| 2013/0113072 A1* | 5/2013 | Liu et al. | 257/532 |

FOREIGN PATENT DOCUMENTS

| | | |
|---|---|---|
| CN | 101814532 | 8/2010 |
| KR | 10-2010-0116198 | 10/2010 |

OTHER PUBLICATIONS

Office Action dated Jun. 25, 2014 with English translation from corresponding application No. KR 10-2012-0138748.
Notice of Allowance dated May 27, 2015 and English translation from corresponding application No. KR 10-2012-0138748.

* cited by examiner

*Primary Examiner* — Kevin Parendo
(74) *Attorney, Agent, or Firm* — Haynes and Boone, LLP

(57) ABSTRACT

A semiconductor device including field-effect transistors (finFETs) and fin capacitors are formed on a silicon substrate. The fin capacitors include silicon fins, one or more electrical conductors between the silicon fins, and insulating material between the silicon fins and the one or more electrical conductors. The fin capacitors may also include insulating material between the one or more electrical conductors and underlying semiconductor material.

20 Claims, 7 Drawing Sheets

DECOUPLING FINFET CAPACITORS

FIELD

This disclosure relates generally to semiconductor fabrication and, more specifically to formation of capacitors.

BACKGROUND

A decoupling capacitor is a capacitor used to decouple one part of an electrical network (circuit) from another. Noise caused by other circuit elements are shunted through the capacitor, reducing the effect noise has on the rest of the circuit. Decoupling capacitors are often found in analog areas of an integrated circuit (IC) and may be formed at the same time as transistors in the IC.

Transistors are formed in both digital and analog areas of an IC. Transistors are typically formed by providing an active area with doped source/drain regions in the substrate, a gate insulating layer over the substrate, and a gate electrode over the gate insulating layer. Contacts connect the source/drain regions and gate electrodes with a conductive interconnect structure having several horizontal conductive pattern layers and vertical via layers formed within a plurality of inter-metal dielectric (IMD) layers. Capacitor fabrication is integrated into the transistor fabrication process using various portions of the transistor as a top electrode of the capacitor, capacitor dielectric, and anode and cathode contacts of the capacitor using minimal additional steps.

As transistor design shifts to a three-dimensional design with multiple gates, metal-oxide metal (MOM) capacitor designs are adapted. MOM capacitors are digitated, multi-finger capacitors separated by dielectrics. The capacitances of these capacitors depend on the dimensions of the conducting portions, which may be metal layers or polysilicon layers. As IC dimensions shrink, the metal layers or polysilicon layers become thinner. The capacitance density of the resulting capacitors also decreases, often very significantly, because the capacitance depends largely on the geometry of the capacitor structure. For these MOM capacitors, the capacitance density decreases about 30% per technology node.

Decoupling capacitors designs with improved capacitance density that are compatible with transistor manufacturing processes continues to be sought.

DETAILED DESCRIPTION

Figure 1:
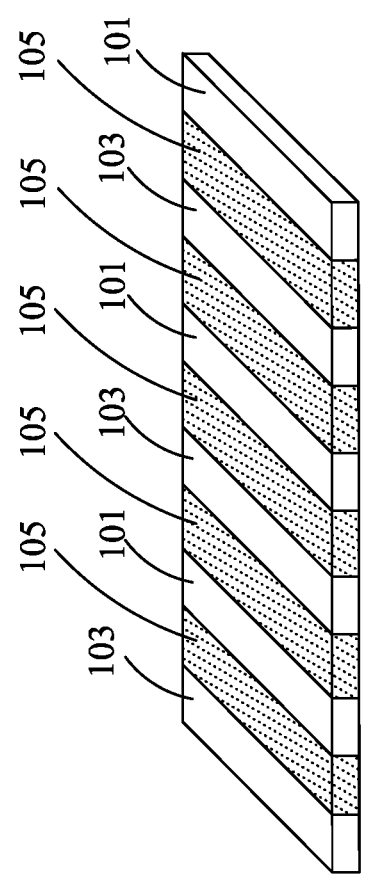
FIG. 1 is a perspective view of a metal-oxide-metal (MOM) capacitor structure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top," and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Like items in different figures are indicated by like reference numerals.

As IC dimensions decrease, planar transistors increasingly suffer from the undesirable short-channel effect, especially "off-state" leakage current, which increases the idle power required by the device. In a fin field-effect-transistor (FinFET), the channel is surrounded by several gates on multiple surfaces, allowing more effective suppression of "off-state" leakage current. FinFETs have higher drive currents and are more compact than conventional planar transistors.

FinFETs use a substantially rectangular fin structure formed generally in several ways. In a first method, bulk silicon on a substrate is etched into rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a variation of the first method, the hardmask for etching in to the bulk silicon is formed by a process using mandrels. A photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the silicon layers below, forming the fin structures. Using the mandrel/spacer method, thinner fins that are closer together can be formed. The fins formed using mandrels are thinner than the resolution of the lithographic tools.

In a second method, the STI features are formed first on bulk silicon material. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or a deposited silicon such as silicon-oninsulator (SOI) with a barrier oxide (BOX) layer between the SOI and the underlying silicon substrate.

Metal-oxide-metal (MOM) capacitors are commonly used in IC chips that use finFET structures. FIG. 1 shows a perspective of the electrical conductors of a simple MOM capacitor. Electrical conductors 101 and 103 are inter-digitated with each other with a dielectric layer 105 between them. Electrical conductors 101 are connected to one of a cathode or anode electrode of the capacitor and electrical conductors 103 are connected to the other one of a cathode or anode electrode. A MOM capacitor can have any number of fingers for electrical conductors connected to one electrode. The fingers may overlay one another with dielectric in between. For example, a number of spaced apart layers such as the structure of FIG. 1 that are each rotated 90 degrees from each other may be used. The electrical conductors 101 and 103 may be metal lines or polysilicon lines that are formed over a silicon substrate during transistor manufacturing. As metal lines and polysilicon lines become thinner, the capacitance density of MOM capacitors decreases, by as much as 30% per technology node. The decrease capacitance density is accompanied by a greater demand for capacitance as greater drive current and smaller size allows more circuitry to be packed into an area.

Figure 2A:
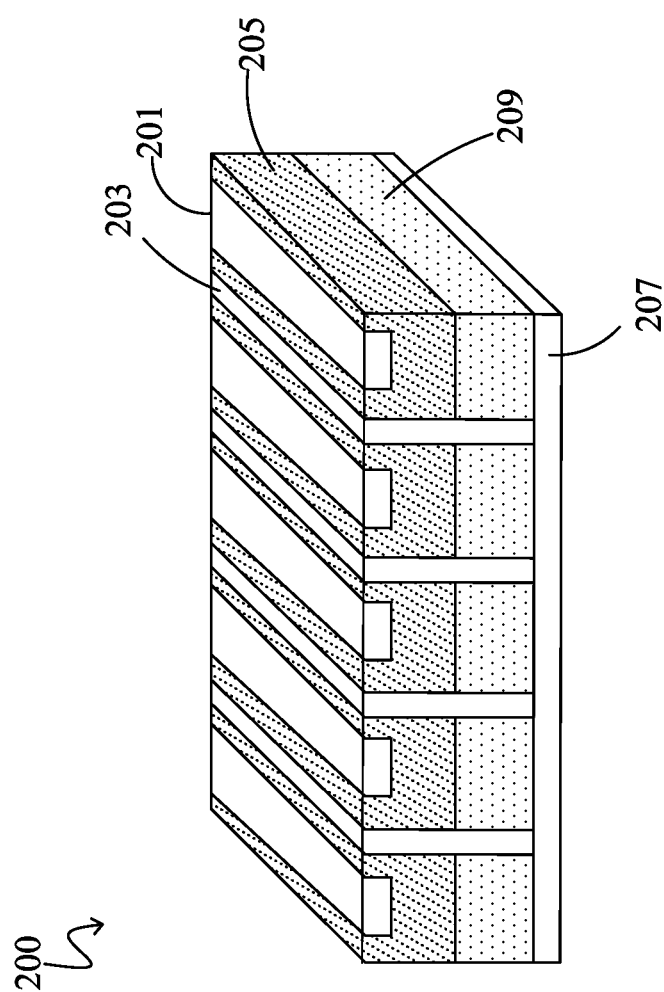
FIG. 2A is a perspective view of a fin capacitor in accordance with various embodiments of the present disclosure.

The present disclosure pertains to a novel fin capacitor that has enhanced capacitance density over comparable sized MOM capacitors and is compatible with the FinFET manufacturing process. FIG. 2 is a perspective view of a fin capacitor 200 in accordance with various embodiments of the present disclosure. The fin capacitor 200 includes first electrical conductors 203/207 connected to one of a cathode or anode electrode (not shown), second electrical conductors 201 connected to another of a cathode or anode electrode (not shown), and insulating material 205/209 between the electrical conductors 203/207 and 201.

The first electrical conductors 203/207 are made of silicon material. Together, the electrical conductors 203/207 connect to either the positive or negative electrode of the fin capacitor. Electrical conductors 203 are silicon fins formed during FinFET formation processes connected to silicon substrate 207. In certain embodiments, the silicon fins 203 are formed out of a silicon substrate by etching a silicon substrate between a hardmask or using a mandrel process as described above and etching between spacers formed around mandrels. In other embodiments, the silicon fins 203 are grown on the silicon substrate 207 in trenches formed between the silicon substrate and an oxide layer.

The insulating material 205/209 are dielectrics around which the electrical field for the fin capacitor is formed. The insulating material 209 is formed during the silicon fin formation process either as the shallow trench isolation (STI) deposited after fins are formed or the STI between which the silicon fins are grown. The insulating material 209 is usually silicon oxide or any other STI material. Other STI material may include silicon oxynitride, silicon nitride, carbon doped silicon oxide or any other dielectric material used during the fin formation process. The insulating material 205 may be the same material as insulating material 209 deposited together with insulating material 209 or in a subsequent operation. For example, the insulating material 205 and 209 together may be the STI forming the trenches from which the fins are grown. In another example, the insulating material 205 may be deposited after STI material 209 is formed during the fin formation process. Further, the insulating material 205 may also be different materials deposited after the STI material 209 is formed during the fin formation process. In some instances, the insulating material 205 may have a silicon oxide with a different oxygen content or a silicon oxynitride material over the silicon oxide 209. In other cases, the insulating material 205 may include air.

The second electrical conductors 201 are also formed as part of the FinFET formation process. The electrical conductors 201 may be a metal layer within the FinFET structure (M0 layer), a metal layer above the FinFET structure (M1 layer), or a polysilicon layer deposited as part of the FinFET gate formation process. The electrical conductors 201 are connected to either the positive or negative electrode of the fin capacitor. Depending on the size of the fin capacitor, a number of electrical conductors 201 may be connected together. The 5 electrical conductors 201 of FIG. 2 may be connected as one or two or three fin capacitors. The electrical conductors 201 may be made of any metal, alloy, or compound commonly found in semiconductor processing. In some embodiments, the M0 or M1 layer may be made of tungsten, tantalum, titanium or copper. Other materials include TiN, WN, TaN, Ru, Ag, Al, TiAl, TiAlN, TaC, TaCN, TaSiN, Mn, Ru, Co, and Zr. The electrical conductors 201 may also be at any elevation relative to the silicon fins 203 as long as it is between the silicon fins 203 from a top view and is separated from the silicon fins 203 by a capacitor dielectric material such as insulating material 205 and 209.

Figure 2B:
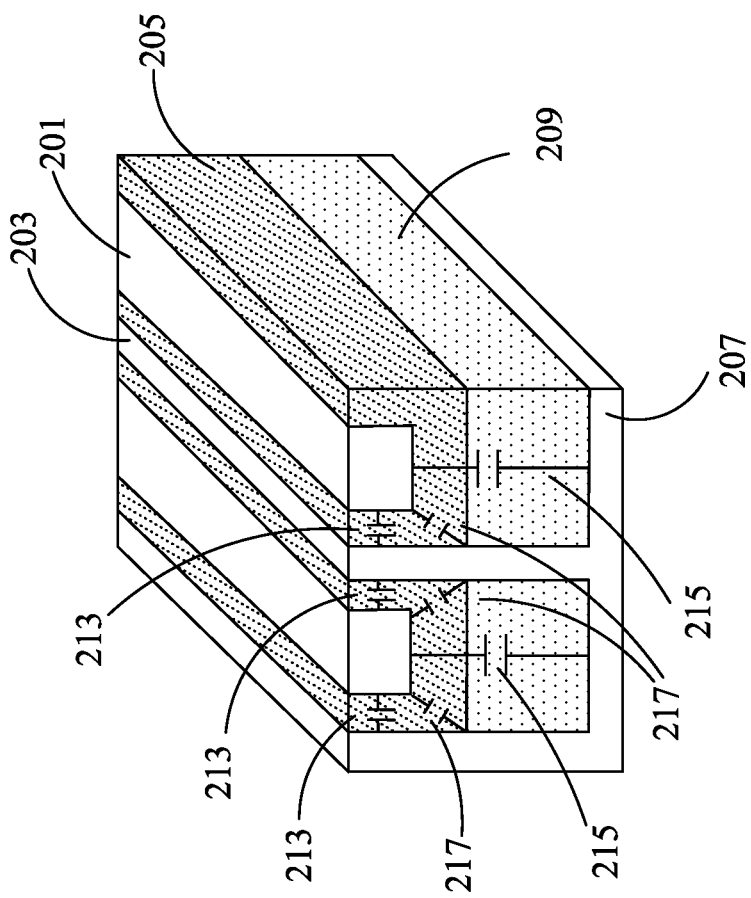
FIG. 2B is a perspective view of a portion of the fin capacitor of FIG. 2A showing the various capacitances in accordance with various embodiments of the present disclosure.

The capacitance, or the ability to store electrical energy, of the fin capacitor may be derived from any of two electrical conductors connected to oppositely charged electrodes as long as there is no direct electrical conduction between them, as is illustrated in FIG. 2B for a portion of the fin capacitor 200. Capacitance is found in many ways. One such way is an overlap capacitance 213 found between electrical conductor 201 and adjacent silicon fin 203 when a bottom of the electrical conductor 201 is not above a top of the silicon fin 203. When the electrical conductors 201 and 203 are exposed to opposite charges, an electrical field develops between them in a form of overlap capacitance 213. Note that each electrical conductor 201 and each silicon fin 203 can have two neighboring electrical conductors and form two overlap capacitances 213 each. Another overlap capacitance (215) is found between the electrical conductor 201 and the underlying silicon substrate 207. Another capacitance is fringe capacitance 217 found between an edge or outside perimeter of the electrical conductor 201 and a non-overlapping portion of the silicon fin 203. The overall capacitance of the fin capacitor is a function of all the various capacitances found between components of the fin capacitor.

As compared to the MOM capacitor of FIG. 1, the fin capacitor formed from the same FinFET manufacturing process has a much higher capacitance density. The fin capacitor structure decreases the pitch between electrical conductors (fingers) connected to the same electrode. In one example, the distance between electrical conductors 103 of FIG. 1 may be about 160 nanometers (nm) and the distance between electrical conductors 203 of FIG. 2 may be about 100 nm. This pitch difference can increase the capacitance density by about 75%. The space between opposite electrical conductors is also decreased. In the example, the distance between electrical conductors 103 and 105 in FIG. 1 may be about 60 nm and the shortest distance between electrical conductors 203 and 201 of FIG. 1 may be about 30 nm. The spacing difference can increase the capacitance density by almost 100%. A modeling of the total capacitance density increase results in an increase of 238% over the MOM capacitor formed in the same area. As transistor dimensions continue to decrease, the difference in capacitance density for the different capacitor structures would only increase as the spacing between electrical conductors becomes even closer together.

Figure 3A:
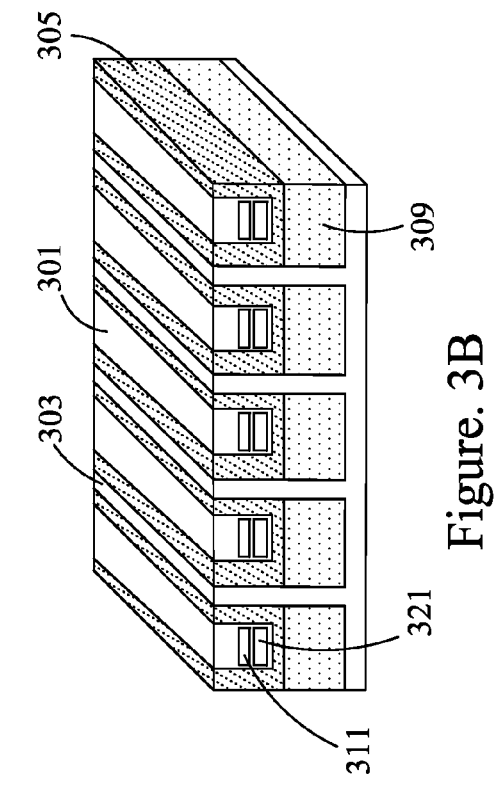
FIGS. 3A to 3H are perspective views of various fin capacitors in accordance with various embodiments of the present disclosure.

FIGS. 3A to 3H shows various embodiments of a fin capacitor in accordance with the present disclosure. In FIG. 3A, the electrical conductor 301 is formed directly over another electrical conductor 311. The electrical conductors 301 and 311 may be formed of a same material, such as two different layers of metal layer M0, or be formed of different materials. For example, the electrical conductor 311 may be formed of polysilicon with electrical conductor 301 formed of a metal, alloy, or metal containing compound. The electrical conductors 301 and 311 are connected (not shown in FIG. 3A) to one of an anode or cathode electrode for each fin capacitor. Capacitance may be found between electrical conductors 301 and 303, between electrical conductors 311 and 303, between electrical conductors 311 and 307 in any of the capacitance types discussed. Insulating layers 305 and 309 are disposed between the electrical conductors 301/311 and 303/307.

Figure 3B:
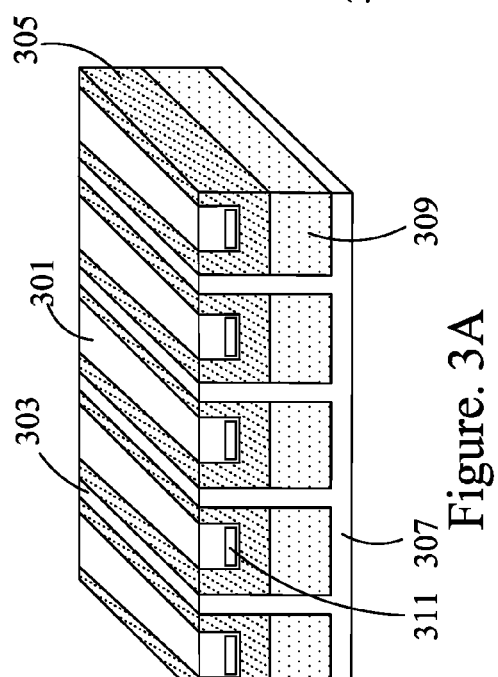

In other embodiments, more than two layers of conductors may be used between the silicon fin conductors 303, as shown in FIG. 3B. The fin capacitor of FIG. 3B includes a 3 layer electrical conductor stack 321, 311, and 301 between the fin conductors 303. While FIG. 3B shows that a top surface of the stack is coplanar with top of the fin conductors 303, a portion of the stack may protrude the plane formed by the top of the fin conductors 303. Conversely, the top of the stack may also be embedded below the plane formed by the top of the fin conductors 303. The electrical conductors 301, 311, 321 may be formed of a same material, such as two different layers of metal layer M0 plus one layer of metal layer M1, or be formed of different material. For example, the electrical conductor 321 may be formed of polysilicon with electrical conductors 311 and 301 formed of a metal, alloy, or metal containing compound. The electrical conductors 301, 311, and 321 are connected (not shown in FIG. 3B) to one of an anode or cathode electrode for each fin capacitor. Capacitance may be found between electrical conductors 301 and 303, between electrical conductors 311 and 303, between electrical conductors 321 and 303, between electrical conductors 321 and 307 in any of the capacitance types discussed. Insulating layers 305 and 309 are disposed between the electrical conductors 301/311/321 and 303/307. In some embodiments, the first electrical conductor layer 321 may be formed directly on the insulating material layer 309 without an intervening insulating material 305.

Figure 3C:
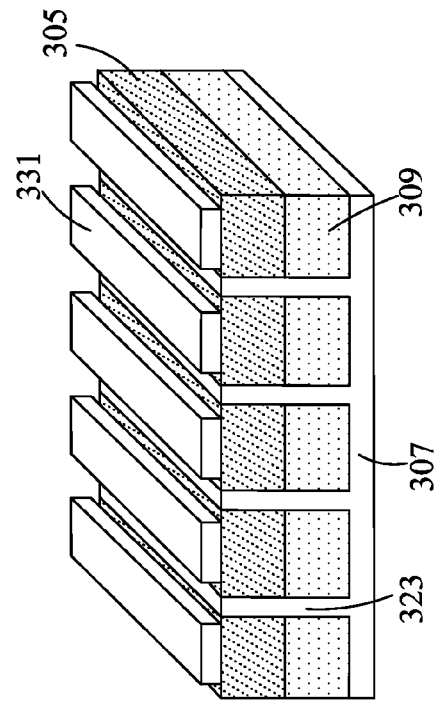

FIG. 3C shows another embodiment where two layers of conductors are used between the fin conductors 303. However, as opposed to the fin capacitor of FIG. 3A, the electrical conductors 301 and 323 do not directly contact each other. Insulating material 305 is disposed between the electrical conductors 301 and 323. The electrical conductors 301 and 323 may be formed of a same material or different material, such as two different layers of metal layer M0, or one of polysilicon and one of a metal, alloy, or metal containing compound. For example, the electrical conductor 323 may be formed of polysilicon with electrical conductor 301 formed of a metal. The electrical conductors 301 and 323 are connected (not shown in FIG. 3C) to one of an anode or cathode electrode for each fin capacitor. Capacitance may be found between electrical conductors 301 and 303, between electrical conductors 323 and 303, and between electrical conductors 323 and 303 in any of the capacitance types discussed. Insulating layers 305 and 309 are disposed between the electrical conductors 301, 323, and 303/307.

Note that in the embodiment of FIG. 3C, no capacitance is found between electrical conductors 301 and 323 even though they are separated by a dielectric because they are connected to the same electrode.

Figure 3D:
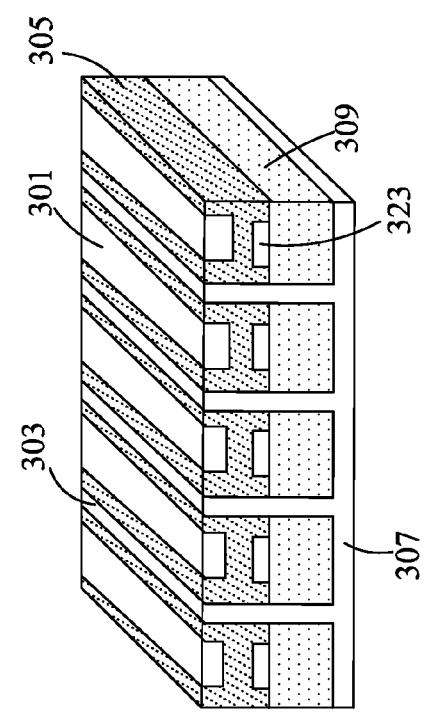

FIG. 3D shows a fin capacitor embodiment where a bottom surface of the electrical conductor 331 is at the same plane or higher than a plane formed by the tops of the fin conductors 303. The electrical conductor 331 may be a metal layer such as M1 formed of a metal, alloy, or a metal containing compound. The electrical conductors 331 are connected (not shown in FIG. 3D) to one of an anode or cathode electrode for each fin capacitor. Capacitance may be found between electrical conductors 331 and 303 and between electrical conductors 331 and 307 in some of the capacitance types discussed. For example, overlap capacitance may be found only between electrical conductors 331 and 307. Insulating layers 305 and 309 are disposed between the electrical conductors 331 and 303/307.

Figure 3E:
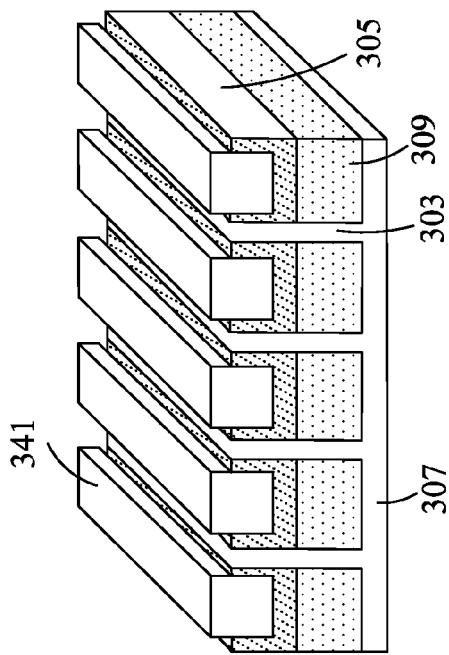

FIG. 3E shows a fin capacitor embodiment combining features of the fin capacitor of FIGS. 3C and 3D. The fin capacitor of FIG. 3E includes two or more electrical conductor layers (331 and 321) where some of the electrical conductor layers do not directly contact each other and at least a portion of the electrical conductor 331 protrudes above a plane formed by the tops of the fin conductors 303. The electrical conductor 331 may be a metal layer such as M1 formed of a metal, alloy, or a metal containing compound. The electrical conductor 321 may be formed of polysilicon or a metal, alloy, or a metal containing compound. The electrical conductors 321 and 331 are connected (not shown in FIG. 3E) to one of an anode or cathode electrode for each fin capacitor. Capacitance may be found between electrical conductors 331 and 303, between electrical conductors 321 and 303, and between electrical conductors 321 and 307 in any of the capacitance types discussed. Insulating layers 305 and 309 are disposed between the electrical conductors 331, 321, and 303/307. In some embodiments, the first electrical conductor layer 321 may be formed directly on the insulating material layer 309 without an intervening insulating material 305. Note that in the embodiment of FIG. 3E, no capacitance is found between electrical conductors 331 and 321 even though they are separated by a dielectric because they are connected to the same electrode.

Figure 3F:
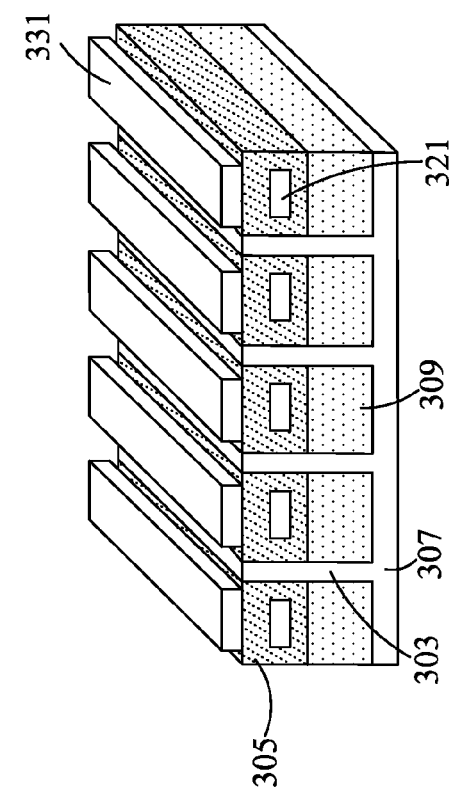

FIG. 3F shows a fin capacitor embodiment where at least a portion of the electrical conductor 341 protrudes above a plane formed by the tops of the fin conductors 303. The electrical conductor 331 may be one or more metal layers such as M0 and/or M1 formed of a metal, alloy, or a metal containing compound. The electrical conductors 341 are connected (not shown in FIG. 3F) to one of an anode or cathode electrode for each fin capacitor. Capacitance may be found between electrical conductors 341 and 303 and between electrical conductors 341 and 307 in any of the capacitance types discussed. Insulating layers 305 and 309 are disposed between the electrical conductors 341 and 303/307. In some embodiments, the electrical conductor layer 341 may be formed directly on the insulating material layer 309 without an intervening insulating material 305.

Figure 3G:
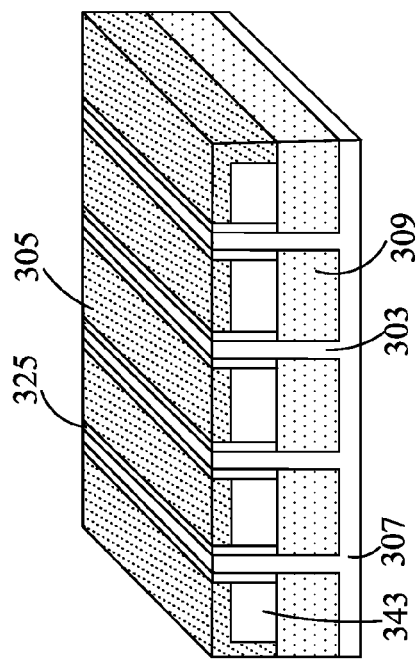

FIG. 3G shows fin capacitor embodiments having a spacer material 325 between the electrical conductors 341 and fin conductors 303. The spacer material 325 is an insulating material that may or may not be the same as the insulating materials 305 and 309. A spacer may be deposited during FinFET manufacturing process around a gate structure. For the fin capacitor, the spacer material 325 is deposited over exposed fins 303 and insulating material 309. The spacer material may include silicon nitride or silicon oxide and may be formed in multiple layers. While FIG. 3G shows only the spacer material 325 between the electrical conductor 341 and fin conductor 303, another insulating material, such as insulating material 305, may also be disposed between the spacer 325 and the electrical conductor 341.

Portions of the spacer material over the tops of the fins and in the bottom of the trench between the fins may be etched away, leaving the portion on the fin sidewalls. In some embodiments, the portions of the spacer material over the fins 303 are removed in subsequent processing but the portions in the bottom of the trench between the fins may not be removed.

The electrical conductor 341 is then formed between the spacers in one or many layers comprising a same or different material. In certain embodiments of FIG. 3G, the insulating material 305 is optional (i.e., when the electrical conductor 341 is formed directly over the insulating material 309). The electrical conductors 341 are connected (not shown in FIG. 3G) to one of an anode or cathode electrode for each fin capacitor. Capacitance may be found between electrical conductors 341 and 303 and between electrical conductors 341 and 307 in any of the capacitance types discussed.

Figure 3H:
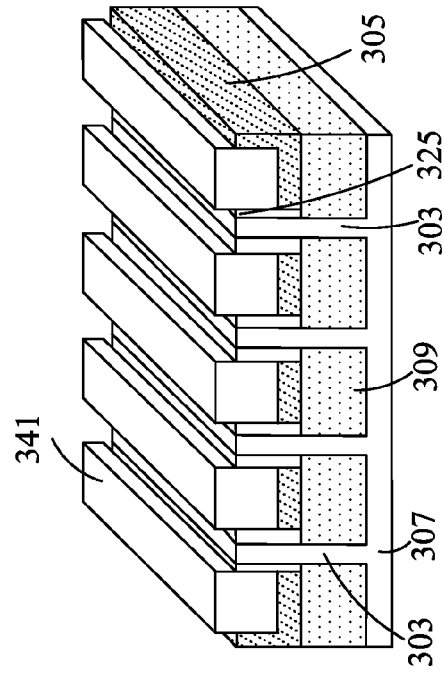

FIG. 3H shows a variation of the fin capacitor embodiment of FIG. 3G where the electrical conductor 343 is embedded within insulating material 305. The electrical conductor 343 may include one or more layers of polysilicon, metal, alloy, or metal-containing compounds. The spacer material 325 is formed as described in association with FIG. 3G. After the electrical conductors 343 are formed, an insulating material 305 is formed over the electrical conductors 343. The electrical conductors 343 are connected (not shown in FIG. 3H) to one of an anode or cathode electrode for each fin capacitor.

The embodiments of fin capacitor shown in FIGS. 2 and 3A to 3H in accordance with various embodiments of the present disclosure are merely examples and are not meant to be an exhaustive list. Additional embodiments may be envisioned by one skilled in the art using a silicon fin based transistor manufacturing process. The number of electrical conductor layers, interconnect structure, and insulating material selection are some example parameters that may vary according to design and process needs without affecting the spirit of the present disclosure.

Figure 4:
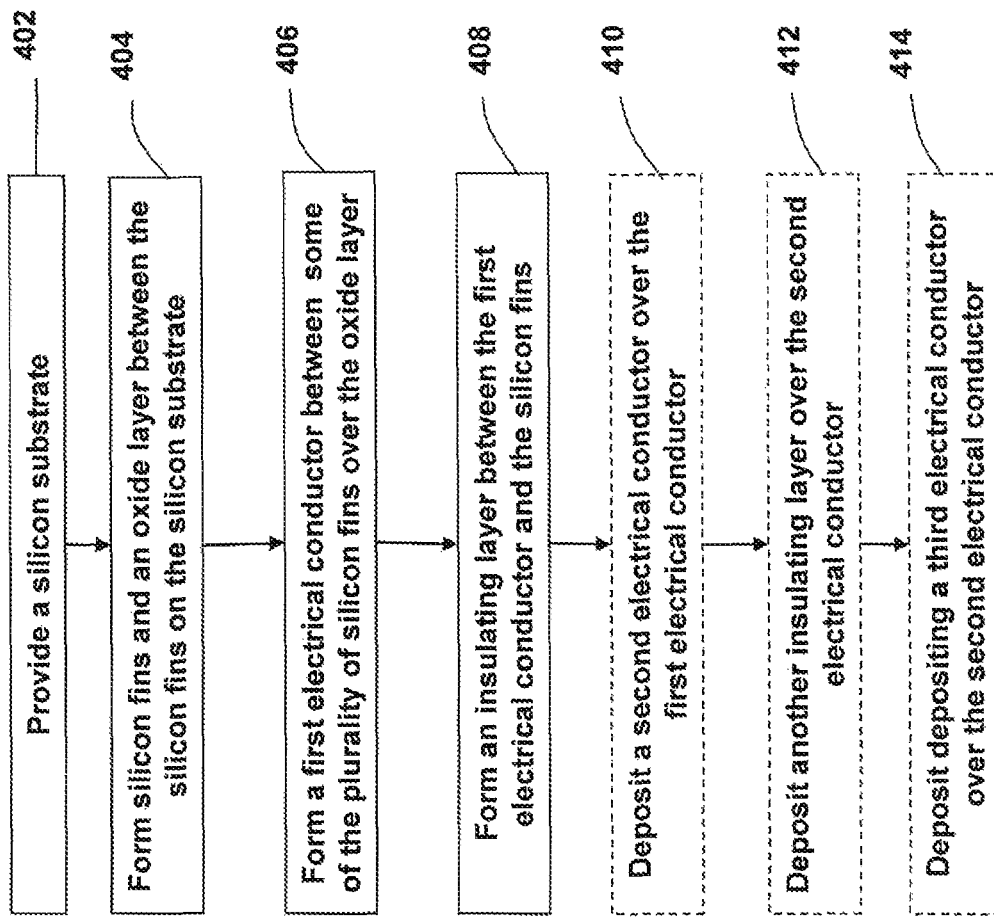
FIG. 4 is a flow chart of methods for forming fin capacitors in accordance with various embodiments of the present disclosure.

The present disclosure also pertains to a method of forming the fin capacitors. As discussed, the method of forming the fin capacitors is compatible with the FinFET manufacturing process such that little or no additional steps are required to form the fin capacitors. FIG. 4 is a flow chart of methods for forming fin capacitors in accordance with various embodiments of the present disclosure. In operation 402, a silicon substrate is provided. The silicon substrate may be a bare silicon wafer or a substrate having various processes already performed thereon. For example, the substrate may include silicon formed in a silicon-on-insulator (SOI) process or may have been subjected to various surface treatment and doping operations.

Silicon fins and an oxide layer are formed in operation 404. The oxide layer is formed between the silicon fins on the silicon substrate. The silicon fins and the oxide layer are formed as part of the FinFET manufacturing process as described above. In operation 406 a first electrical conductor is formed between some of the silicon fins over the oxide layer where the fin capacitors are formed. The first electrical conductor may be polysilicon grown as a part of the FinFET gate formation process or metal, alloy, or metal-containing compounds deposited as part of the M0 or M1 layer formation process. The electrical conductor is formed between the silicon fins in a top view and is parallel to the silicon fins.

In operation 408, an insulating layer is formed between the first electrical conductor and the silicon fins. The insulating layer may be a dielectric material deposited as part of the interconnect metal dielectric or as part of the FinFET gate dielectric. In certain embodiments, a fin capacitor is formed once the silicon fins and the electrical conductors are connected to their respective electrodes.

In embodiments where more than one electrical conductor layer is used in the fin capacitor, optional operations 410, 412, and/or 414 may be included. Variations include where only operation 410 is performed, where both operations 410 and 412 are performed, where all three optional operations are performed, where operations 410 and 414 are performed, and various orders of performing these operations.

In operation 410, a second electrical conductor is deposited over the first electrical conductor. Note that this operation may be performed before or after operation 408 of forming an insulating layer, depending on whether the second electrical conductor is to directly contact the first electrical conductor, as in embodiments of FIGS. 3A and 3B, or be separated from the first electrical conductor, as in embodiments of FIGS. 3C and 3E.

In operation 412, a second insulating layer may be deposited over the second electrical conductor. In operation 414, a third electrical conductor may be deposited over the second electrical conductor with or without intervening insulating layer.

The various electrical conductors may be deposited using processes such as sputtering, chemical vapor deposition, electroplating, electroless plating, and electron beam deposition. The conductors may be deposited first and unwanted portions removed in subsequent processes or portions of the work product may be masked using a photomask before deposition. Further, selective deposition methods may be used to avoid having to use a photomask.

The various insulating materials may be deposited using different chemical vapor deposition processes. Depending on the material and geometry, one skilled in the art can select the appropriate process to deposit the insulating materials.

Figure 5:
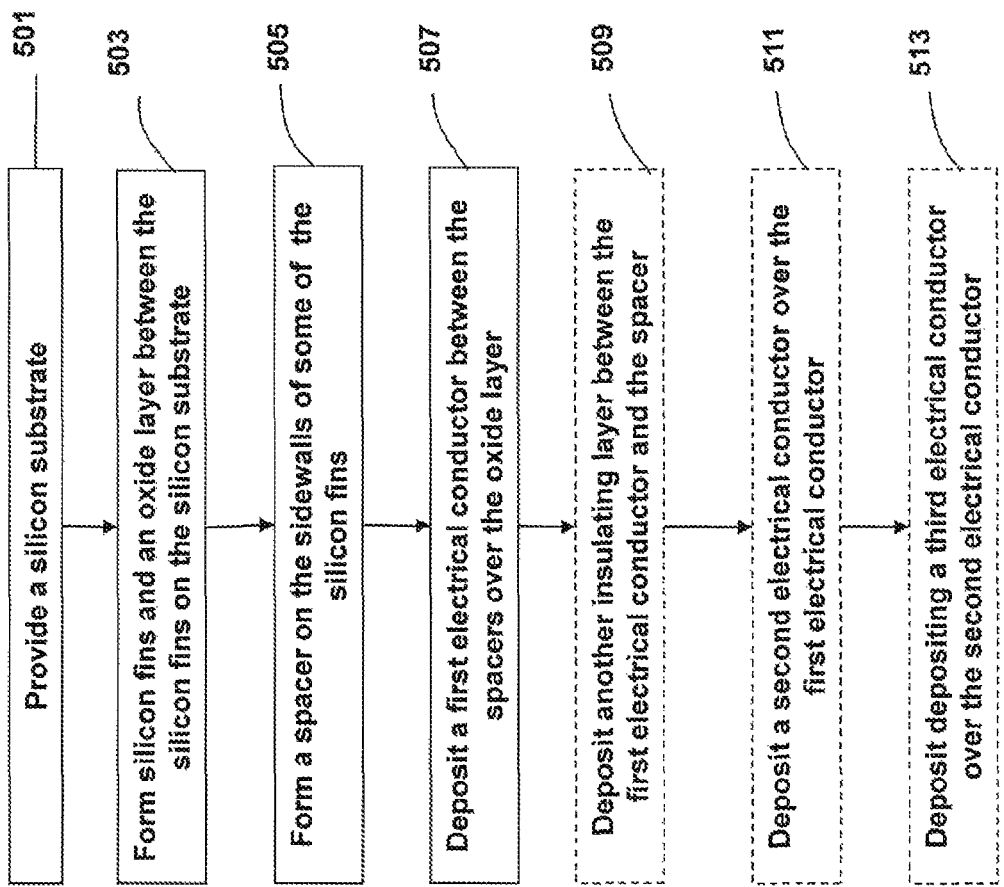
FIG. 5 is a flow chart of another method for forming fin capacitors in accordance with various embodiments of the present disclosure.

FIG. 5 is a flow chart of methods for forming fin capacitors in accordance with various embodiments of the present disclosure. Operations 501 and 503 are the same as operations 402 and 404 of FIG. 4. In operation 505, a spacer is formed on the sidewalls of some of the silicon fins where the fin capacitors are formed. The spacer around the fins may be formed during the FinFET gate formation process at the same time the spacers are formed around the FinFET gate.

In operation 507, a first electrical conductor is deposited between the spacers over the oxide layer. If the spacer is formed with the gate formation process, the first electrical conductor may be metal, alloy, or metal-containing compounds deposited as part of the M0 or M1 layer formation process. If the spacer is formed before the gate formation process, the first electrical conductor may be additionally a polysilicon material. The electrical conductor is formed between the silicon fins in a top view and is parallel to the silicon fins. In some embodiments, the spacer is the only capacitor dielectric between the electrical conductor and the fin conductor. In other embodiments, another insulating material is deposited between the first electrical conductor and the spacer in operation 509.

Just as operations 410, 412, and 414 from the process of FIG. 4 are optional, one or more operations 509, 511, and 513 may be included and/or in different orders of performance. In one embodiment, operation 509 is performed. In another embodiment, operation 511 is performed. In still other embodiments, operations 511 and 513 are performed. In yet other embodiments, all three operations are performed.

In operation 511, a second electrical conductor is deposited over the first electrical conductor. Note that this operation may be performed before or after operation 509 of forming an insulating layer, depending on whether the second electrical conductor is to directly contact the first electrical conductor or is to be separated from the first electrical conductor. In operation 513, a third electrical conductor may be deposited over the second electrical conductor with or without intervening insulating layer.

The various electrical conductors may be deposited using processes such as sputtering, chemical vapor deposition, electroplating, electroless plating, and electron beam deposition. The conductors may be deposited first and unwanted portions removed in subsequent processes or portions of the work product may be masked using a photomask before deposition. Further, selective deposition methods may be used to avoid having to use a photomask.

The various insulating materials may be deposited using different chemical vapor deposition processes. Depending on the material and geometry, one skilled in the art can select the appropriate process to deposit the insulating materials.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate having a plurality of fin field-effect transistors (FinFETs) and a plurality of fin capacitors, wherein each of said plurality of fin capacitors further comprises:
a plurality of silicon fins extending from and above a top surface of the substrate, wherein the plurality of fins includes two adjacent silicon fins each having a first sidewall and an opposing second sidewall, the first and second sidewall extending from and being perpendicular to the top surface of the substrate;
at least one electrical conductor between and parallel with the two adjacent silicon fins, wherein a top surface of the plurality of silicon fins and a top surface of the at least one electrical conductor are coplanar;
a first insulating material between the first sidewall of a first silicon fin of the two adjacent silicon fins and the at least one electrical conductor and also between the first sidewall of a second silicon fin of the two adjacent silicon fins and the at least one electrical conductor, wherein the first insulating material forms an interface with the first sidewall of each of the first and second silicon fins; and
a second insulating material disposed over the top surface of the substrate, under the first insulating material and the at least one electrical conductor, the second insulating material extending from an interface with the first sidewall of the first silicon fin to an interface with the first sidewall of the second silicon fin.

2. The semiconductor device of claim 1, wherein the at least one electrical conductor includes comprises a metal.

3. The semiconductor device of claim 1, wherein the at least one electrical conductor comprises a metal layer and a polysilicon layer.

4. The semiconductor device of claim 1, wherein the at least one electrical conductor comprises a plurality of metal layers.

5. The semiconductor device of claim 4, wherein the plurality of metal layers includes layers of different metals.

6. The semiconductor device of claim 1, wherein the first insulating material comprises spacer material on first sidewalls of the two adjacent silicon fins.

7. The semiconductor device of claim 1, wherein the fin capacitors are decoupling capacitors.

8. The semiconductor device of claim 1, wherein a portion of the substrate of a semiconductor material is disposed below the second insulating material.

9. The semiconductor device of claim 1, wherein each of the two adjacent silicon fins has, in a lateral direction, a first width that is less than half of a second width of the at least one electrical conductor in the lateral direction.

10. The semiconductor device of claim 1, further comprising:
a second electrical conductor between and parallel with the two adjacent silicon fins and parallel to the at least one electrical conductor; and
a third insulating material between the at least one electrical conductor and the second electrical conductor.

11. The semiconductor device of claim 1, wherein the first insulating material includes:
a bottom portion between the at least one electrical conductor and the substrate;
a first side portion extending upward from the bottom portion and sandwiched between the corresponding electrical conductor and the first sidewall of one of the two adjacent silicon fins; and
a second side portion extending upward from the bottom portion and sandwiched between the corresponding electrical conductor and the first sidewall of the other one of the two adjacent silicon fins.

12. The semiconductor device of claim 11,
wherein the first and second insulating materials including different dielectric materials.

13. The semiconductor device of claim 1, wherein the at least one electrical conductor includes polysilicon.

14. The semiconductor device of claim 1, wherein a top most portion the at least one electrical conductor is coplanar with an uppermost portion of the first insulating material.

15. The semiconductor device of claim 1, wherein the at least one electrical conductor comprises polysilicon, the polysilicon being coplanar with the top surface of the two adjacent fins.

16. The semiconductor device of claim 1, wherein the first insulating material comprises a bottom surface and side surfaces, the bottom surface is along the interface between the first insulating material and the second insulating material, and each of the side surfaces entirely physically contact one of the first sidewalls of the two adjacent silicon fins.

17. The semiconductor device of claim 1, wherein the second insulating layer extends under the bottom, first side, and second side portions of the first insulating material.

18. The semiconductor device of claim 1, wherein
the two adjacent silicon fins are separated by a first width in a first direction,
the first insulating layer has a second width in the first direction, and
the second insulating layer has a third width in the first direction, wherein the first, second and third widths are equal.

19. A device, comprising:
a substrate having a fin capacitor, wherein the fin capacitor further comprises:
two adjacent silicon fins extending from and above a surface of the substrate, wherein each of the two adjacent silicon fins has a first sidewall and an opposing second sidewall, the first and second sidewall extending from the surface of the substrate;
at least one electrical conductor between and parallel with the two adjacent silicon fins, wherein a top surface of the two adjacent silicon fins and a top surface of the at least one electrical conductor are coplanar;
a first insulating material between the first sidewall of a first silicon fin of the two adjacent silicon fins and the at least one electrical conductor and also between the first sidewall of a second silicon fin of the two adjacent silicon fins and the at least one electrical conductor, wherein the first insulating material forms an interface with the first sidewall of each of the first and second silicon fins; and
a second insulating material disposed over the surface of the substrate, under the first insulating material and the at least one electrical conductor, the second insulating material extending from an interface with the first sidewall of the first silicon fin to an interface with the first sidewall of the second silicon fin.

20. The device of claim 19, wherein the first and second insulating materials are different.

* * * * *